United States Patent [19]

Weng

[11] Patent Number: 5,136,592
[45] Date of Patent: Aug. 4, 1992

[54] ERROR DETECTION AND CORRECTION SYSTEM FOR LONG BURST ERRORS

[75] Inventor: Lih-Jyh Weng, Lexington, Mass.

[73] Assignee: Digital Equipment Corporation, Maynard, Mass.

[21] Appl. No.: 373,323

[22] Filed: Jun. 28, 1989

[51] Int. Cl.[5] ............................. H03M 13/00
[52] U.S. Cl. .................. 371/39.1; 364/746.1; 371/37.1; 371/37.4; 371/38.1
[58] Field of Search ............ 371/39.1, 37.1, 37.4, 371/38.1, 37.7; 364/746.1

[56] References Cited

U.S. PATENT DOCUMENTS

| | | | |
|---|---|---|---|
| 4,142,174 | 2/1979 | Chen et al. | 371/37.1 |
| 4,336,612 | 6/1982 | Inoue et al. | 371/39.1 |
| 4,359,772 | 11/1982 | Patel | 371/38.1 |
| 4,413,339 | 11/1983 | Riggle et al. | 371/40.1 |
| 4,653,051 | 3/1987 | Sugimura et al. | 371/37.4 |
| 4,698,810 | 10/1987 | Fukuda et al. | 371/37.7 |
| 4,719,628 | 1/1988 | Ozaki et al. | 371/37.4 |
| 4,763,332 | 8/1988 | Glover | 371/37.5 |
| 4,764,927 | 8/1988 | Izumita et al. | 371/38.1 |
| 4,856,003 | 8/1989 | Weng | 371/37.1 |
| 4,866,716 | 9/1989 | Weng | 371/39.1 |
| 4,975,867 | 12/1990 | Weng | 364/746.1 |

Primary Examiner—Jerry Smith
Assistant Examiner—Ly V. Hua
Attorney, Agent, or Firm—Cesari and McKenna

[57] ABSTRACT

The invention is an error detection and correction system which encodes data twice, once for error detection by using a cyclic redundancy check (CRC) code with a generator polynomial, $g(x)$ [in octal form]:

$$g(x) = 24136070365651172433223$$

and a second time for error correction by using a Reed-Solomon error correction code. The system then uses the CRC code to check the data for errors. If errors are found the system uses the error location information supplied by the CRC code and the Reed-Solomon code to correct the errors.

15 Claims, 6 Drawing Sheets

FIGURE 3

$$
\begin{array}{l}
x^0 \rightarrow \\
x^1 \rightarrow \\
x^2 \rightarrow \\
x^3 \rightarrow \\
x^4 \rightarrow \\
x^5 \rightarrow \\
x^6 \rightarrow \\
x^7 \rightarrow \\
x^8 \rightarrow \\
x^9 \rightarrow \\
x^{10} \rightarrow \\
x^{11} \rightarrow \\
x^{12} \rightarrow \\
x^{13} \rightarrow \\
x^{14} \rightarrow \\
x^{15} \rightarrow \\
x^{16} \rightarrow \\
x^{17} \rightarrow \\
x^{18} \rightarrow \\
x^{19} \rightarrow
\end{array}
\begin{bmatrix}
0 & 0 & 0 & 1 \\
0 & 0 & 1 & 0 \\
0 & 1 & 0 & 0 \\
1 & 0 & 0 & 0 \\
17 & 66 & 170 & 100 \\
143 & 127 & 322 & 347 \\
134 & 7 & 277 & 345 \\
124 & 214 & 107 & 236 \\
247 & 331 & 333 & 244 \\
332 & 325 & 274 & 262 \\
167 & 71 & 313 & 204 \\
376 & 201 & 362 & 214 \\
342 & 41 & 263 & 161 \\
366 & 122 & 207 & 42 \\
111 & 371 & 372 & 113 \\
151 & 140 & 277 & 267 \\
15 & 253 & 370 & 137 \\
340 & 273 & 75 & 147 \\
162 & 260 & 141 & 242 \\
104 & 305 & 121 & 321
\end{bmatrix}
=
\begin{bmatrix}
"0" & "0" & "0" & "0" \\
"0" & "0" & "0" & \alpha^0 \\
"0" & \alpha^0 & "0" & "0" \\
\alpha^0 & "0" & "0" & "0" \\
\alpha^{75} & \alpha^{249} & \alpha^6 & \alpha^{169} \\
\alpha^{163} & \alpha^{189} & \alpha^{59} & \alpha^{81} \\
\alpha^{131} & \alpha^{198} & \alpha^{162} & \alpha^{137} \\
\alpha^{143} & \alpha^{49} & \alpha^{253} & \alpha^{149} \\
\alpha^{205} & \alpha^{96} & \alpha^{177} & \alpha^{211} \\
\alpha^{134} & \alpha^{157} & \alpha^{71} & \alpha^{211} \\
\alpha^{43} & \alpha^{154} & \alpha^{236} & \alpha^{140} \\
\alpha^{88} & \alpha^{112} & \alpha^{213} & \alpha^{49} \\
\alpha^{95} & \alpha^{138} & \alpha^{171} & \alpha^{94} \\
\alpha^{173} & \alpha^{148} & \alpha^{13} & \alpha^{101} \\
\alpha^{152} & \alpha^{214} & \alpha^{244} & \alpha^{179} \\
\alpha^{58} & \alpha^{30} & \alpha^{162} & \alpha^{158} \\
\alpha^{104} & \alpha^{178} & \alpha^{116} & \alpha^{64} \\
\alpha^{203} & \alpha^{83} & \alpha^{228} & \alpha^{110} \\
\alpha^{155} & \alpha^{242} & \alpha^{66} & \alpha^{209} \\
\alpha^{102} & \alpha^{123} & \alpha^{208} & \alpha^{161}
\end{bmatrix}
$$

"0" MEANS THE ZERO ELEMENT $GF(2^8)$

FIGURE 5

ERROR DETECTION AND CORRECTION SYSTEM FOR LONG BURST ERRORS

FIELD OF INVENTION

This invention relates to error detection and correction of stored data in general and more particularly to the correction of long burst errors.

BACKGROUND OF THE INVENTION

The importance of error correction coding of data in digital computer systems has increased greatly as the density of the data recorded on mass storage media, more particularly magnetic tape, has increased. With higher recording densities, a tiny imperfection in the tape can corrupt a large amount of data. In order to avoid losing that data, error correction codes ("ECC's") are employed to, as the name implies, correct the erroneous data.

Before a string of data symbols is recorded on a tape, it is mathematically encoded to form redundancy symbols. The redundancy symbols are then appended to the data string to form code words—data symbols plus redundancy symbols. The code words are stored on the tape. When the stored data is to be accessed from the tape, the code words containing the data symbols are retrieved from the tape and mathematically decoded. During decoding any errors in the data are detected and, if possible, corrected through manipulation of the redundancy symbols [For a detailed description of decoding see Peterson and Weldon, *Error-Correcting Codes*, 2d Edition, MIT Press, 1972].

Stored digital data can contain multiple independent errors. One of the most effective types of error correction codes used for the correction of these multiple errors is a Reed-Solomon code [For a detailed description of Reed-Solomon codes, see Peterson and Weldon, *Error-Correcting Codes*]. To correct multiple errors in strings of data symbols, Reed-Solomon codes efficiently and effectively utilize the various mathematical properties of sets of symbols known as Galois Fields, represented by "$GF(P^q)$", where "P" is a prime number and "q" can be thought of as the number of digits, base P, in each element or symbol in the field. "P" usually has the value 2 in digital computer applications and, therefore, "q" is the number of bits in each symbol.

Data is typically stored on a tape in a long sequence of symbols. Errors in data stored on a tape often occur in long bursts, that is, many erroneous symbols in a row. Techniques designed for detecting and/or correcting single or multiple independent errors, which do not ordinarily occur in bursts, are not well suited for the detection or correction of these long burst errors. Thus special error detection and/or correction techniques are typically employed to handle these long burst errors.

Techniques for the detection of long burst errors currently in use detect single or double bursts with each burst containing up to a predetermined maximum number of erroneous symbols. A code which detects bursts containing a larger number of erroneous symbols is considered more powerful than a code which detects bursts containing fewer erroneous symbols. For example, a well known Fire code detects double bursts of up to 22 bits each in 2 kilobytes of data and a well known, more powerful Burton code detects double bursts of up to 26 bits in 2 kilobytes of data. As the density of the data stored on tapes increases, the number of data symbols involved in the long burst errors increases, also. Such long burst errors may occur soon in data stored on disks due to increases in the density of the stored data. Thus a mechanism is desirable for detecting longer error bursts.

Once a long burst error is detected the erroneous symbols involved are corrected, if possible. The faster the errors can be corrected, the faster the data can be made available to a user. Thus the effective data transfer rate increases as the speed of error correction increases. Accordingly, a mechanism is desirable for quickly correcting the detected long burst errors.

SUMMARY OF INVENTION

An error correcting system encodes data which is to be recorded on a magnetic tape twice, once horizontally for error detection and once vertically for error correction. First the system encodes a stream of d multi-bit data symbols to form c redundancy symbols using a powerful cyclic redundancy check (CRC) code. The CRC code is characterized by the following generator polynomial g(x): [in octal vector form]

$$g(x) = 2413607036565172433223$$

where the vector components are the binary coefficients of the terms of the polynomial representing from left-to-right the coefficients of the highest-to-lowest degree terms of the polynomial. The CRC code is capable of detecting a single long burst error containing up to 64 bits and double long burst errors containing up to 28 bits each.

The error correction system concatenates the d data symbols and the c CRC redundancy symbols to form a CRC code word. The encoder then forms a group of CRC code words such that each of the corresponding symbols in the CRC code words in a group are vertically aligned. The aligned symbols form a series of one-symbol wide columns.

The system further encodes, using a Reed-Solomon error correction code, each column containing data symbols. It does not encode the columns containing the CRC redundancy symbols. The encoding generates, for each column, a predetermined number, n, of ECC redundancy symbols. The encoder then includes these ECC redundancy symbols in the group such that the ECC redundancy symbols are aligned with the data symbols to which they correspond. Thus the encoder forms a series of columns each of which has b symbols, b-n data symbols and n ECC redundancy symbols.

The ECC redundancy symbols corresponding to the data symbols in a group are themselves encoded using the CRC code. The various ECC redundancy symbols and the corresponding CRC redundancy symbols form n ECC code words. Thus the $n^{th}$ ECC code word contains (i) the $n^{th}$ ECC symbol corresponding to each column of data symbols, and (ii) the related c CRC symbols. A complete group of code words contains b-n data code words and n ECC code words. The various code words are recorded on the tape as a group, i.e., in multiple tracks, or bit-serially, i.e., in a single track. Accordingly, the group may require re-assembly when the data is retrieved.

When data is retrieved from the tape it is first assembled in groups, if necessary, and then each group is decoded, code word- by- code word, using for each code word the CRC redundancy bits contained therein. The CRC code detects with certainty a single error of 64 bits or less and double long burst errors, each of which may be up to 28 bits long. The code also detects up to seven random errors in each CRC code word. If errors are detected in the data CRC code words the system uses the Reed-Solomon code ECC redundancy symbols and one of several decoding algorithms to correct them column by column. Error correction is in most cases simplified because the CRC decoding points to the vertical locations of the errors.

The particular Reed-Solomon code used to encode the data encodes it such that single errors with known locations can be quickly and easily corrected. If the CRC code detects errors in only one code word, code word t, there is at most one erroneous data symbol per column, i.e., the symbol in column location t. To calculate the error value associated with the symbol in location t in a particular column the system adds together (XOR's) the symbols in the column. The sum is the error value, and thus, the system corrects the error by adding together the symbol and the associated error value. If the symbol in location t is not erroneous the calculated error value is ZERO.

When the CRC decoding indicates errors in a particular code word the system treats as erroneous every data symbol in that code word. Thus the system calculates an error value for each column.

If the CRC decoding indicates that multiple CRC code words contain errors and one or more of the CRC code words is a data code word, the system first determines which of the columns contain errors. The system then engages in error correction for these particular columns.

To determine whether a particular column contains any errors the system encodes the column data symbols using the Reed-Solomon code and thus generates new ECC redundancy symbols. It then adds (XOR's) these symbols to the corresponding ECC redundancy symbols retrieved from the tape to formulate remainder symbols $REM_0, REM_1, \ldots, REM_n$. If the remainder symbols are all ZEROS the two sets of ECC symbols are the same, and thus, the data symbols in the column are error-free. If one or more of the remainder symbols are non-zero the two sets of ECC symbols are not the same and the column contains one or more erroneous symbols. The system then performs error correction for each column containing errors.

If the CRC points out as erroneous between one and n CRC code words the system simultaneously solves a set of n equations based on the remainder symbols, $REM_0, REM_1 \ldots, REM_n$, and the specific vertical locations of the erroneous code words. The system uses matrices manipulated by Galois Field operations to solve these equations. The solutions are the error values corresponding to the column symbols in the locations corresponding to the erroneous code words.

If the CRC code indicates that n+1 or more code words contain errors, the system corrects the errors by assuming there are n or fewer actual errors per column and using on of several correction procedures. It then uses the CRC code to determine whether all the errors in the data code words have been corrected. If the CRC detects further errors either the system repeats the entire error correction procedure until the CRC code indicates that all the errors are corrected, or the system labels the data uncorrectable.

One procedure for correcting the n+1 errors is to assume that there is only one erroneous symbol, with an unknown location, in any particular column. The errors can then be corrected using a mechanism for correcting single errors with unknown locations. The system does not know in which of the many possible error locations the one erroneous symbol resides, and thus, the location of the error is considered unknown.

First, the system examines the remainder symbols $REM_0, REM_1 \ldots, REM_n$ for a particular column. If all of the remainder symbols are ZEROS, it indicates that the column data is error-free and no error correction is required. If only one of the remainder symbols, for example, $REM_i$, is non-zero, it indicates that the symbol in column location i is erroneous. The error value corresponding to this symbol is $REM_i$ and thus the error is corrected by adding $REM_i$ to that symbol.

If more than two remainder symbols are non-zero the system uses the remainder symbols to initialize n shift registers of a cyclic shifter. The shifter cyclically shifts the symbols in a column backwards by dividing the remainder symbols by the reciprocal of the Reed-Solomon generator polynomial used to encode the data. Due to the cyclic property of the Reed-Solomon code the error values required to correct the errors in the column are not affected.

The shifting mechanism shifts the column symbols until the contents of registers 1, 2, ..., (n-1) are all ZEROS and the resulting symbol in the $n^{th}$ register is non-zero. If the shifter shifts the symbols a total of L times the symbol in column location n+L is erroneous and the $n^{th}$ register contains the corresponding error value. If after the shifter is shifted b times, that is, one shift for each symbol location in a column, an error location is not found error correction for that particular column fails. The system then goes on to correct the errors in the next column.

Once error correction has been attempted for each of the columns the system again examines the group of code words for errors using the CRC code. If there are further errors the system corrects them, if possible, by using an error correction procedure designed for the number of remaining errors.

BRIEF DESCRIPTION OF DRAWINGS

The above and further advantages of the invention may be better understood by referring to the following description in conjunction with the accompanying drawings, in which:

FIG. 3 illustrates a matrix M used in error correction;

FIG. 5 is a view of various error configurations.

DETAILED DESCRIPTION

The mathematical operations involving Reed-Solomon code ECC redundancy symbols are performed, respectively, using Galois Field addition, multiplication and division. Galois Field addition is performed by exclusive-Or'ing (XOR) the code symbols bit-by-bit, Galois Field multiplication, represented by the symbol "*", is modulo p(x), where p(x) is a primitive polynomial which characterizes the Galois Field.

Figure 1:
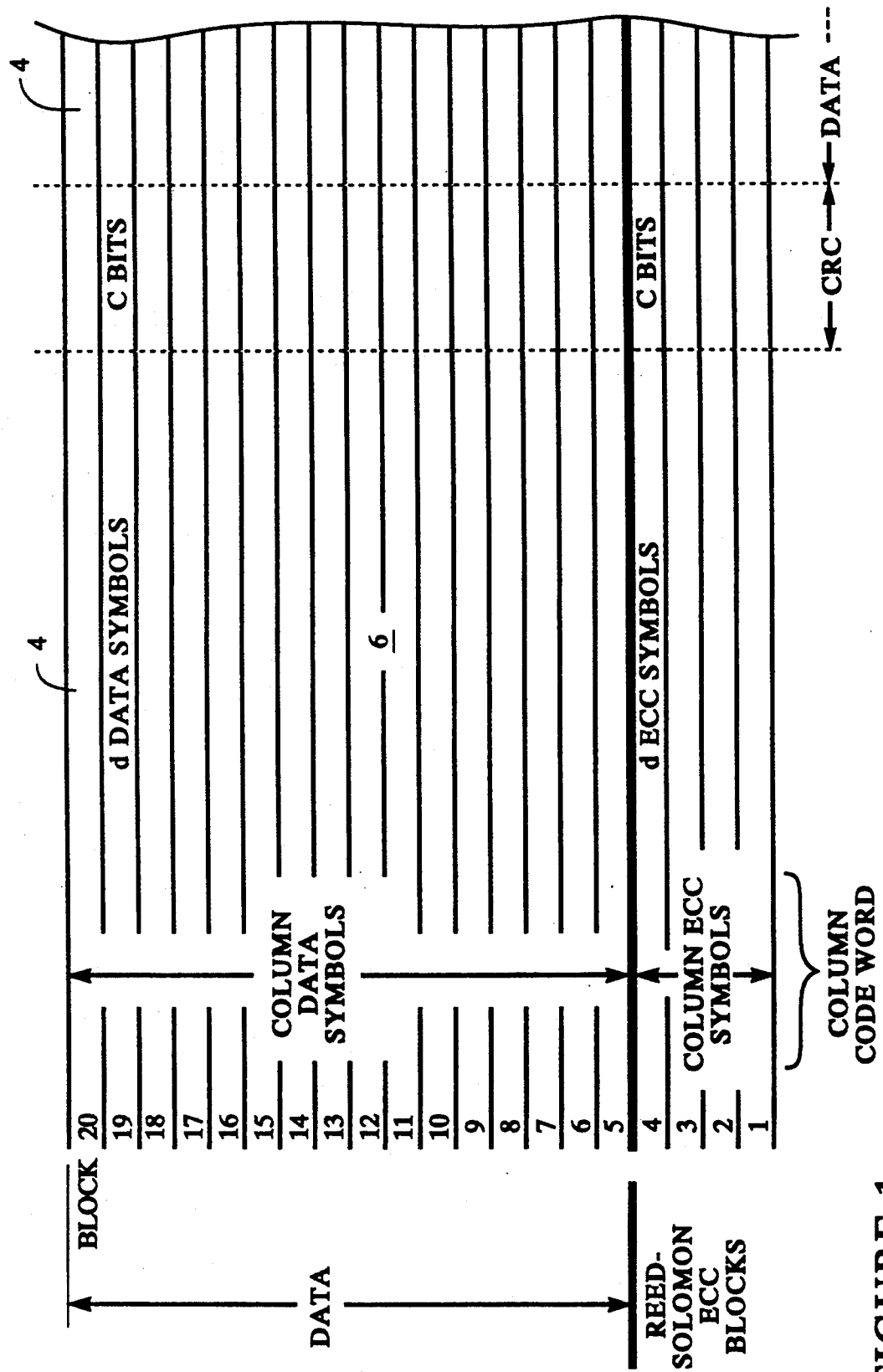
FIG. 1 is a view of a magnetic tape recorded in accordance with preferred embodiment.

FIG. 1 illustrates a group 6 of b code words 4, where b=20 in the preferred embodiment. The code words 4, oriented horizontally, contain d data or information symbols and c associated redundancy bits. The generation of the c redundancy bits is discussed below. The code words 4 are vertically aligned such that the corresponding symbols in each of the code words 4 form a series of one-symbol wide columns.

The c bits in each code word 4 are generated by encoding the code word data or information symbols using a cyclic redundancy check (CRC) code which is well suited to detecting long burst errors. The c CRC redundancy bits are appended to the associated data or information symbols to form a CRC code word. The code words numbered 5-20 in FIG. 1 contain d data symbols and c CRC redundancy bits. The code words numbered 1-4 contain d information symbols and c CRC redundancy bits. In the preferred embodiment d=2 kilobytes and c=64 bits. The CRC code encoding is discussed in more detail below.

The d information symbols in each of the code words 1-4 are Reed-Solomon error correction code (ECC) redundancy symbols. The ECC redundancy symbols are generated by encoding each of the columns containing data symbols; the columns containing CRC bits are not encoded. The ECC redundancy symbols recorded in a particular column, that is, the symbols in code words 0-4 of a column containing data symbols, correspond to the data symbols in that column. Thus each of these columns forms a code word of the Reed-Solomon code.

The d ECC redundancy symbols in each of the code words 1-4 are then encoded using the CRC code. The c CRC redundancy bits generated by this encoding are appended to the ECC redundancy symbols to form ECC code words, that is, code words in the CRC code. Accordingly, errors in the stored ECC redundancy symbols can be detected. Each column containing CRC bits forms a Reed-Solomon code word, also, because both the Reed Solomon code and the CRC code are linear codes.

Figure 2:
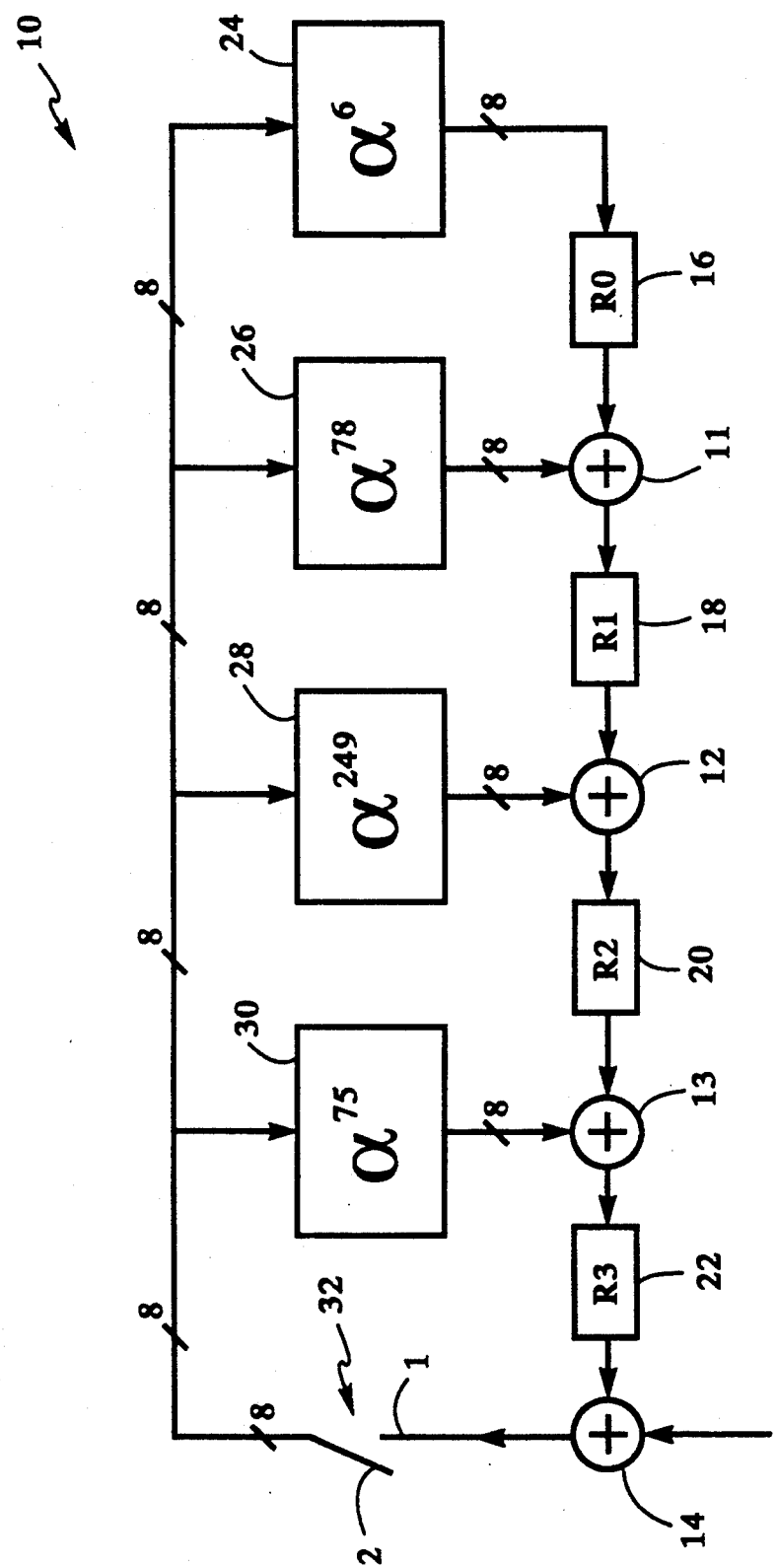
FIG. 2A depicts an encoding system configured in accordance with a preferred embodiment of the current invention.
FIG. 2B depicts a Reed-Solomon code encoder.
Figure 2A:
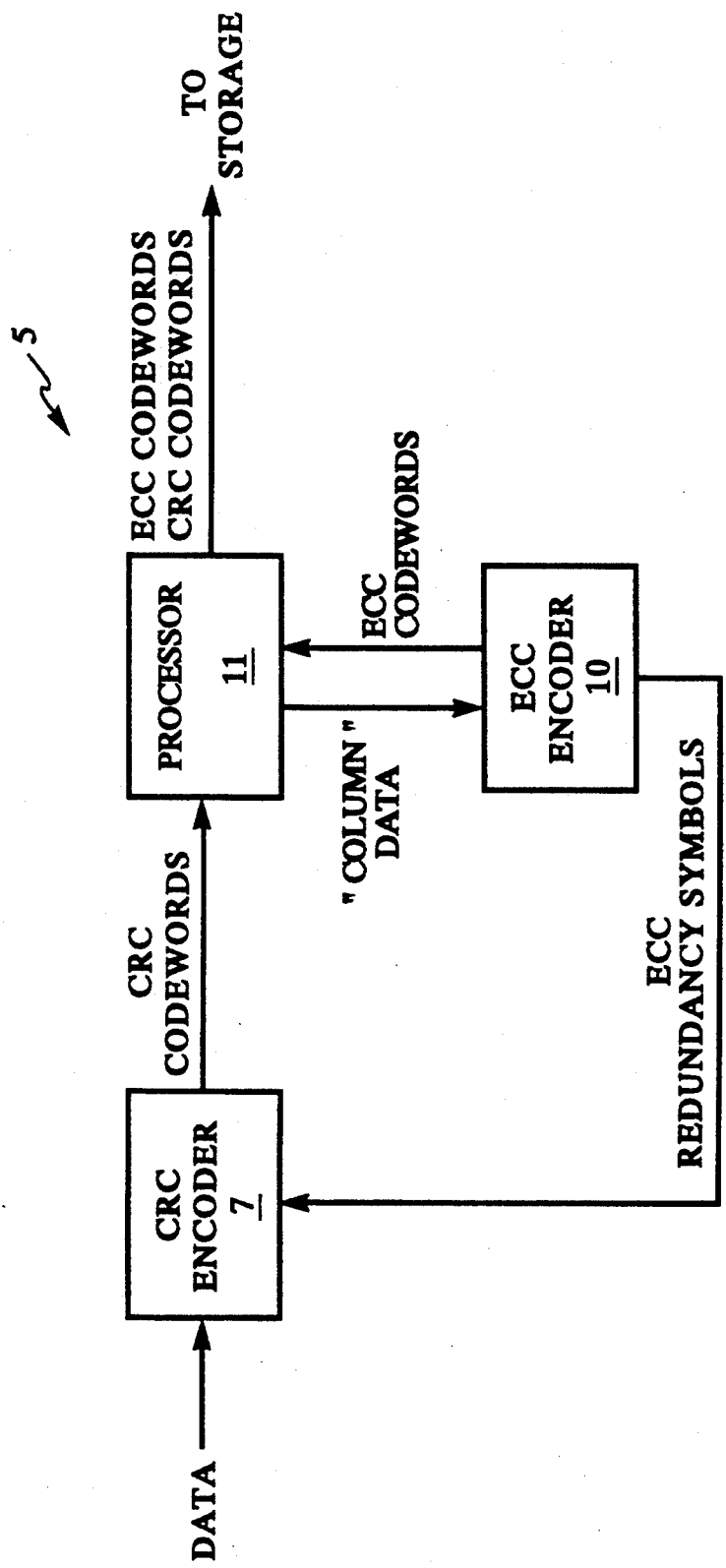

FIG. 2A depicts in block diagram form an encoding system 5, which includes a CRC encoder 7 which, to generate the CRC bits, encodes the appropriate data or ECC redundancy symbols using a cyclic redundancy check code characterized by the following degree sixty-four binary generator polynomial g(x) presented as an octal vector:

$$g(x) = (3)*(3)*(100003)*(102043)*(110013)*(1560513)$$

or $$g(x) = 2413607036565172433223$$

where the vector components are the binary coefficients of the terms of the polynomial representing from left-to-right the coefficients of the highest-to-lowest degree terms. The CRC encoder, which is of conventional design, encodes in a conventional manner the data or information symbols using this CRC generator polynomial. The CRC encoder 7 then supplies the CRC code words to a processor 11 for temporary storage in the group configuration shown in FIG. 1. The data may also be encoded using the reciprocal of g(x), g*(x) (in octal form):

$$g^*(x) = (3)*(3)*(140001)*(1142041)*(150011)*(1512073)$$

or $$g^*(x) = 3113305362565703417205.$$

The length of the CRC code is shortened from its natural length of over 8 billion bits to slightly over 17,000 bits. The shortened code is a powerful code which is capable of detecting with certainty in the 17,000 bits of data a single burst error of up to 64 bits in length. The code further detects with certainty double burst errors of up to 28 bits each. The Hamming distance of the code is at least eight, thus the code detects up to seven independent errors in any location, i.e., seven random erroneous bits as opposed to burst errors.

The shortened code actually detects 28-bit double burst errors in 17,907 bits of data. Thus a block may contain 2 kilobytes of actual data and up to 1523 bits of appended control information.

As set forth above, the columns of data in a group are encoded for error correction purposes using a Reed-Solomon code in an ECC encoder 10, which is discussed in more detail below with reference to FIG. 2B. The code encodes the data over a Galois Field GF($2^8$) which is characterized by a primitive polynomial p(x) represented by the octal vector p(x) =455, which in binary form is:

$$x^8+x^5+x^3+x^2+1.$$

The particular Reed-Solomon code used to encode the data columns is specified by the generator polynomial G(x):

$$G(x) = (x + \alpha^0) * (x + \alpha^1) * (x + \alpha^2) * (x + \alpha^3)$$
$$= x^4 + \alpha^{75}x^3 + \alpha^{249}x^2 + \alpha^{78}x + \alpha^6$$

where $\alpha$ is the primitive element of the Galois Field. The data is encoded over Galois Field GF($2^8$) in the preferred embodiment because the elements of the field are 8-bit symbols, or bytes, and most computer hardware is set up to handle data organized in bytes.

FIG. 2B depicts an encoder 10 for encoding the column data symbols. The encoder 10 includes a set of 8-bit registers 16, 18, 20 and 22 that are cleared prior to the encoding operation. The contents of the registers are applied to exclusive OR circuits (XOR's) 11, 12, 13 and 14 respectively. The input to the encoder is applied to the XOR 14 in byte serial, bit parallel fashion over eight input lines.

During the input operation a switch 32 is in position 1 so that the output of the XOR 14 is applied to Galois Field multipliers 24, 26, 28 and 30. The outputs of multipliers 26, 28 and 30 are applied to XOR's 11, 12 and 13, respectively, and the output of multiplier 24 is applied to the register 16. The Galois Field multipliers 24-30 multiply their inputs by the factors $\alpha^6$, $\alpha^{78}$, $\alpha^{249}$ and $\alpha^{75}$ respectively.

Accordingly, as each input byte is applied to the encoder 10, it is summed bit-by-bit (modulo 2) with the contents of the register 22. The sum is then simultaneously multiplied (modulo p(x)) by Galois Field multipliers 24-30 which contain the coefficients of all but the highest power of x in G(x). The respective products of the byte and the coefficients are then added (modulo 2) to the contents of the registers 16-22.

After all of the data bytes in a particular column have been applied to the encoder 10, the encoder switch 32 is placed in position 2 and the contents of registers 16-22 are unloaded as the ECC redundancy symbols, $R_3$, $R_2$, $R_1$, $R_0$, respectively, by shifting their contents to the left. It will be noted that during the shifting operation with the switch 32 in position 2, the vertical inputs of the XOR's pass the contents of the registers 22-26 without modifying them.

Encoders of this type are well known in the art.

The encoding system 5 formulates in processor 11 (FIG. 2A) a complete group by aligning beneath the appropriate column data symbols, in code words 1-4, the ECC redundancy symbols. Thus code word 4 contains the $R_3$ redundancy symbols, code word 3 contains the $R_2$ redundancy symbols, et cetera. A complete column, that is, the corresponding data symbols and the associated ECC redundancy symbols in code words 1-20, form a Reed-Solomon code word.

A processor 11 writes the code words to the tape. It will be understood by those skilled in the art that the processor may write the code words in any format, for example, it may write them as a string of bits with one code word following another. Thereafter, when the code words are retrieved from the tape, the processor re-assembles the group 6.

When a user requests data from the tape the processor retrieves from the tape the code words 4 (FIG. 1) containing the requested data symbols and any other code words required to re-assemble the group 6. An error correction processor (not shown) then determines if there are errors in any of the code words 4 in the group 6 by decoding each of them using the component CRC bits. If the CRC code does not detect any errors the error correction processor forwards the required data to the requesting user. If the CRC code detects errors it points out the erroneous code words, and thus, the locations of the errors. Accordingly, the error correction processor performs error correction as appropriate, to correct the symbols in these code words.

If all the errors are located in code words 1-4, that is, the ECC code words, the data is assumed error-free and the error correction processor immediately forwards the data to the requesting user. However, if errors are detected in the code words containing data symbols, the error correction processor corrects the errors (if possible) using the ECC redundancy symbols. To correct the errors the error correction processor selects an appropriate error correction routine based on the number and location of the detected errors.

If the CRC bits indicate that only one CRC code word is erroneous, for example, code word $b_i$, the processor corrects the erroneous data symbols in that code word using a procedure that is specifically designed for correcting single errors with known locations. For a given column containing data symbols the column either is error-free or it contains one erroneous symbol, the symbol in the column location corresponding to code word $b_i$.

The error correction processor does not, at this point, determine if a particular column contains an erroneous symbol. Instead, it attempts to correct the symbol in location $b_i$ in every column. Thus, for every column, the error correction processor generates an error value corresponding to the symbol in location $b_i$. It then corrects the symbol by combining it with, i.e., adding it to, the generated error value. The generated error value for a symbol which is not in error is ZERO. Thus adding this error value to the symbol does not change it. Alternatively, the error correction processor could calculate the error values only for columns containing data symbols and ignore the columns containing CRC symbols.

To generate an error value for a potentially erroneous symbol in location $b_i$ the processor adds together, using Galois Field addition, all the symbols in a column. This sum is the error value associated with the data symbol in location $b_i$. Thus the error correction processor adds the sum to the erroneous symbol to correct it. The same result is achieved by adding together all the symbols in the column except the symbol in location $b_i$. This sum is the corrected data symbol. Thus this sum replaces the symbol in location $b_i$ in the data transmitted to the user.

This single-error correction procedure is possible only with Reed-Solomon codes which have $(X+\alpha^0)$ as a factor of their generator polynomials. Having this term as a factor means that the generator polynomial, which is a degree four polynomial, may have more than two distinct terms with non-zero coefficients. Thus an associated encoder 10 will most likely include more than two distinct Galois Field multipliers. This may result in an encoder which is not the simplest one for encoding data for single-error correction. However, the ease of correcting errors contained in a single CRC code word using such a Reed-Solomon code outweighs the increased complexity of the encoder.

If the CRC bits indicate that more that one code word contains erroneous symbols, for example, two code words, the processor corrects the errors using an error correction procedure designed to correct between one and four errors with known locations. First, the error location processor determines which columns contain errors by calculating a remainder for each column. The remainder for a particular column is calculated by: (i) encoding the retrieved column data symbols using encoder 10 to generate new ECC redundancy symbols corresponding to the retrieved data symbols; and (ii) comparing these new ECC redundancy symbols with the retrieved ECC redundancy symbols.

The two sets of ECC symbols are compared by XOR'ing bit-by-bit the corresponding symbols. The resulting symbols are the remainder symbols $REM_0$, $REM_1$, $REM_2$, and $REM_3$. If the remainder symbols are all ZEROS the two sets of ECC symbols are the same and the data column is assumed error-free. If one or more of the remainder symbols are non-zero the column contains errors.

To calculate the error values for the columns containing errors, that is, the columns with non-zero remainders, the error correction processor solves for each of these columns a set of four simultaneous equations. Each of these equations involves a different column remainder symbol.

In order to formulate the equations the processor generates a matrix M with rows corresponding to $X^e$ modulo $G(x)$, where e is the symbol location associated with a given matrix row and $G(x)$ is the Reed-Solomon code generator polynomial. The rows of matrix M can be thought of as vectors with components corresponding to coefficients of $(X^3, X^2, X^1, X^0)$. Thus, for example, the matrix M row corresponding to $X^3$ is (1, 0, 0, 0) while the matrix row corresponding to $X^4$ is $(X^{75}, X^{249}, X^{78}, X^6)$.

The error correction processor may generate the rows of the matrix M using encoder 10 as follows: First, the processor initializes encoder registers 16, 18, 20 and 22 to the values 0,0,0,1, respectively. The registers then contain the elements of the matrix row corresponding to $X^0$. The processor next cycles, i.e., clocks, the encoder 10 once with switch 32 in position 1 to generate in the registers the elements of the second row (i.e. $X^1$) of the matrix M. The processor clocks the encoder a total of 19 times with switch 32 in position 1 and uses the contents of the registers 16, 18, 20 and 22 generated by each encoder cycle as the rows $X^1$ through $X^{19}$ of the matrix M. This matrix is then stored for use in the future. FIG. 3 depicts the complete matrix M in both octal and binary forms. It will be understood by those skilled in the art that the matrix is generated only once and used thereafter for all error correction.

The error value equations for a particular column with detected errors, for example, in blocks 4 and 6, are:

$$REM_3 = Y(e_4) * 17 + Y(e_6) * 134$$

$$REM_2 = Y(e_4) * 66 + Y(e_6) * 7$$

$$REM_1 = Y(e_4) * 170 + Y(e_6) * 277$$

$$REM_0 = Y(e_4) * 100 + Y(e_6) * 345$$

where $Y(e_4)$ and $Y(e_6)$ are the error values for the column symbols in column locations 4 and 6, respectively, and the coefficients of the $Y(e_4)$ and $Y(e_6)$ terms are the elements of matrix M rows $X^4$ and $X^6$, respectively, such that the equation for $REM_3$ has as coefficients the fourth column elements of matrix M rows $X^4$ and $X^6$, the equation for $REM_2$ has as coefficients the third column elements of the rows, et cetera. The error correction processor could now solve any two of these equations to determine the error values. However, the processor uses all four equations and the procedure set forth below to determine the error values for 2, 3 or 4 detected errors.

Next to solve the equations the error correction processor formulates for each column containing errors a matrix M'. The matrix M' has rows corresponding to each of the code words in which the CRC detects errors and a bottom row containing as elements the column remainder symbols $REM_0$, $REM_1$, $REM_2$ and $REM_3$. In the example there are two code words containing errors, namely, code words 4 and 6, and thus rows 1 and 2 of matrix M' are the same as rows $X^4$ and $X^6$ of matrix M. The third row of matrix M' is the column remainder $REM_0$, $REM_1$, $REM_2$ and $REM_3$. In this particular example the column remainder is an octal vector 175, 47, 211, 123. Thus matrix M' in octal form is:

$$\begin{array}{c} \text{row } X^4 \rightarrow \\ \text{row } X^6 \rightarrow \\ \text{remainder} \rightarrow \end{array} \begin{bmatrix} 17 & 66 & 170 & 100 \\ 134 & 7 & 277 & 345 \\ 123 & 211 & 47 & 175 \end{bmatrix}$$

The error correction processor next manipulates the matrix M' using column operations to reduce it to a matrix M" which has as elements of the first two columns of the first two rows a 2×2 identity matrix and has as the remaining elements of rows 1 and 2 only ZEROS. In this example, matrix M" is:

$$\begin{bmatrix} 0 & 0 & 0 & 1 \\ 0 & 0 & 1 & 0 \\ 0 & 0 & 135 & 355 \end{bmatrix}$$

If the CRC indicates 3 errors, the corresponding matrix M' has 4 rows and it reduces to a matrix M" containing a 3×3 identity matrix in the first three columns of the first three rows and has only ZEROS as the remaining elements of rows 1-3.

The two column operations performed in reducing matrix M' are: (1) a*[column i]+b*[column j] to replace column i, where "a" is non-zero element of $GF(2^8)$ and "b" is any element of $GF(2^8)$, and (2) interchanging two columns.

When the matrix M" is in this reduced form the last row of the matrix contains the error values associated with the data or ECC redundancy symbols in the erroneous code words. Thus the matrix element in the first column, 355, is the error value associated with the ECC redundancy symbol in code word 4 and the element in the second column, 135, is the error value associated with the data symbol in code word 6. The elements in the two matrix columns which do not correspond to error locations, columns 3 and 4, should be ZEROS. Otherwise, an uncorrectable error condition exists and the calculated error values are rejected.

If only one of the detected errors is in a data code word and each of the other detected errors are in the ECC code words the matrix M' corresponding to the detected errors may be used directly to calculate the error value of the erroneous data symbol. Thus the matrix need not be reduced. If, for example, the errors are detected in ECC code words 0 and 3 and data code word 5, and the remainder symbols for a given column are 321, 335, 360 and 375, the matrix M' is:

$$\begin{bmatrix} 0 & 0 & 0 & 1 \\ 1 & 0 & 0 & 0 \\ 143 & 127 & 322 & 347 \\ 375 & 360 & 335 & 321 \end{bmatrix}$$

The matrix M' has in its first two rows, that is, the rows corresponding to the ECC code words, only ONES and ZEROS. Thus the matrix is already in a reduced form, though not in the reduced form discussed above. The error value corresponding to the code word 5 data symbol is calculated using this matrix M' by dividing the element in the last row of either matrix column 1 or column 2, that is, either of the columns having ZEROS in rows 1 and 2, by the element in row 3 of the same matrix column. Thus the error value for the code word 5 data symbol, in octal form, is:

$$360/127 = 335/322 = 115$$

An alternative error correction procedure for correcting double data-symbol errors with known locations utilizes the cyclic property of Reed-Solomon codes to "shift" one of the errors into an ECC symbol location. Thus the symbols are cyclically shifted backwards by some number of locations without altering the error values associated with the symbols.

After the shift the error correction processor calculates the error value associated with the symbol which is still in a data symbol location using the procedure set forth above for a single data-symbol error. The processor then calculates the error value corresponding to the remaining erroneous symbol using the single error with known location procedure set forth above, that is, by adding together all the symbols in the column including the corrected data symbol.

Figure 4:
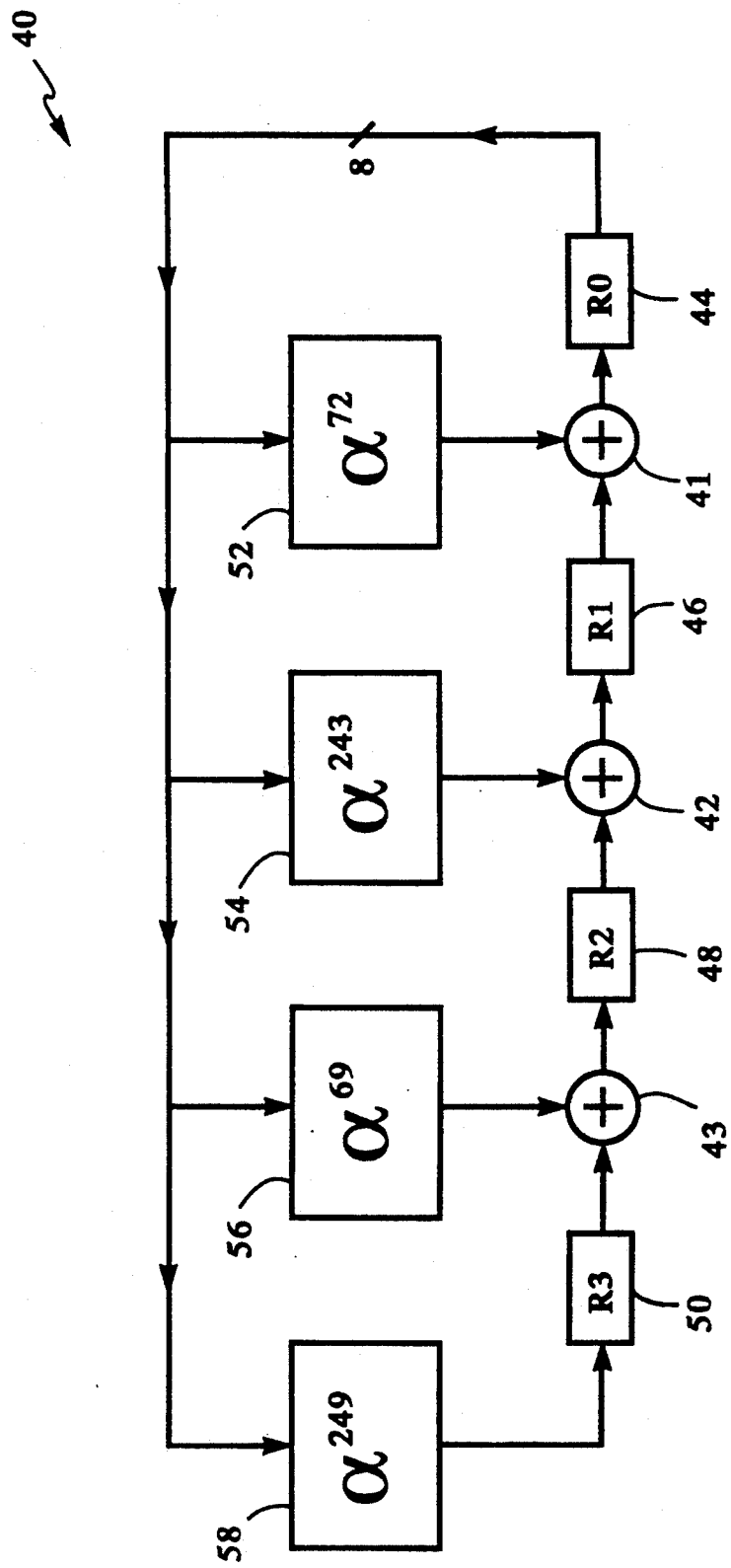
FIG. 4 depicts a cyclic shifter.

Referring now to FIG. 4, in order to cyclically shift the symbols in a column backwards the error correction processor uses a cyclic shifter 40, which is a linear shift register set up to multiply the symbols in registers 44, 46, 48, 50 by the reciprocal of G(x). Thus Galois Field multipliers 52–58 contain the coefficients of the terms of the reciprocal of G(x). For example, multiplier 52 multiplies terms by $\alpha^{78}/\alpha^6$, which is the coefficient of the $X^1$ term of G(x) divided by the coefficient of the $X^0$ term of G(x). The multiplicands of multipliers 54–58 are the $X^2$, $X^3$, and $X^4$ coefficients of G(x) divided by the $X^0$ coefficient (the coefficient of the $X^4$ term is 1, which in GF($2^8$) is the same as $\alpha^{255}$).

To shift a particular column the error correction processor loads the column remainder symbols $REM_0$, $REM_1$, $REM_2$ and $REM_3$ into registers 44, 46, 48, 50, respectively. It then shifts the cyclic shifter 40 L times until the location of only one of the errors corresponds to a data symbol and the location of the other error corresponds to an ECC symbol. Thus the error locations are shifted from locations $e_1$ and $e_2$ to locations $e_1$-L and $e_2$-L.

The error correction processor then uses the symbols in the registers 44, 46, 48, 50 as the column remainder symbols in formulating matrix M'. The first two rows of matrix M' correspond to the column locations $e_1$-L and $e_2$-L and the third row corresponds to the shifted remainder symbols. The processor then calculates the error value for the data symbol by dividing the appropriate elements of rows 2 and 3 of matrix M'. The processor corrects the symbol by adding to it the calculated error value.

To calculate the error value for the remaining error, that is, the symbol in location $e_2$, the processor adds together the column symbols, including the corrected symbol in location $e_1$. The processor then corrects the symbol in location $e_2$ by adding to it the calculated error value.

Figure 5:
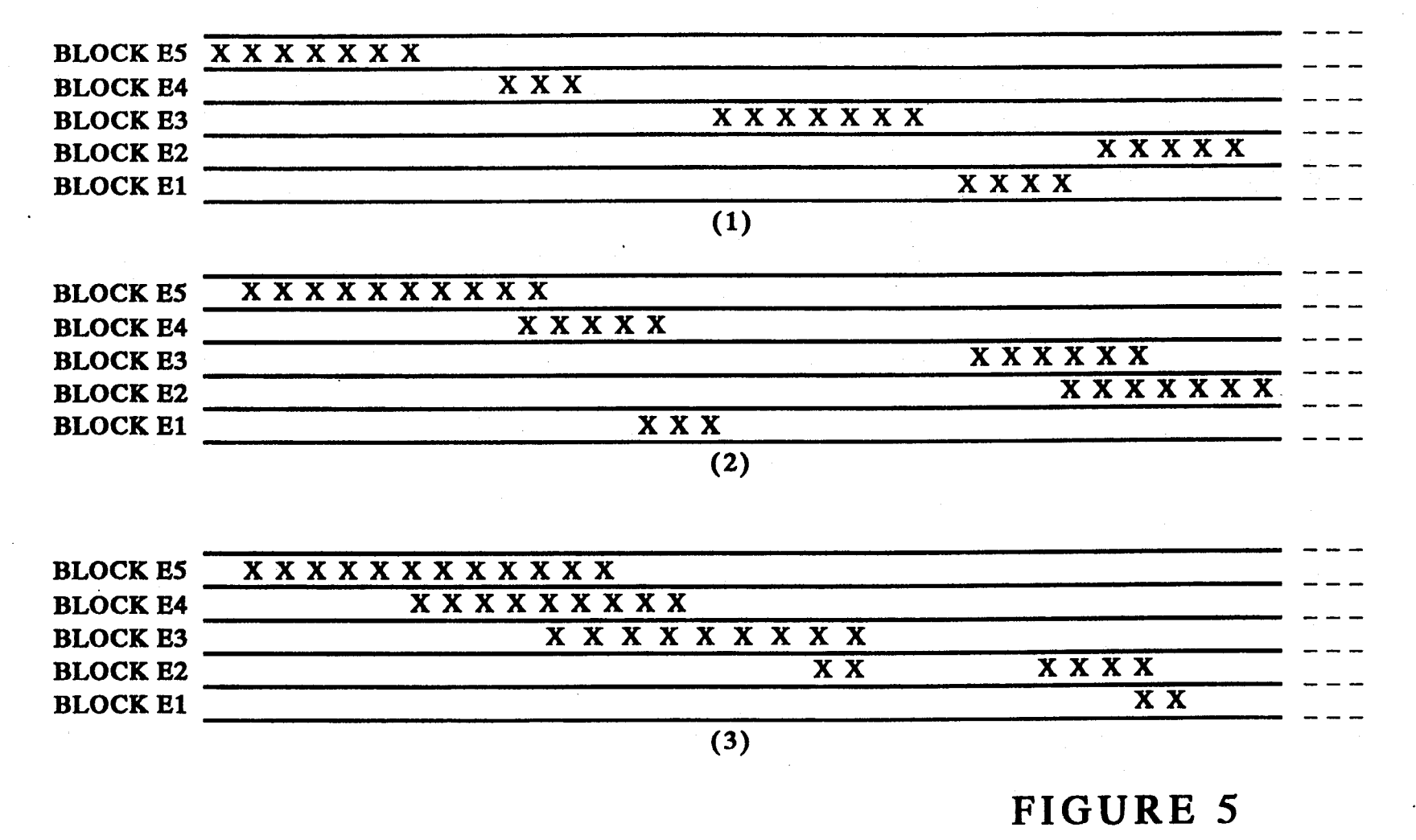

If more than four errors are detected the error correction processor corrects them by first correcting a predetermined number of errors, f, and repeating the error correction procedure for any remaining errors. FIG. 5 depicts several configurations of five or more erroneous code words. The "X's" denote erroneous symbols. Configuration 1, for example, depicts code words with errors occurring such that each column contains at most one error. Thus the errors can be corrected using single-error correction techniques. Similarly configuration 2 has at most two errors per column and the errors can be corrected using double-error correction techniques, and so forth. The system does not have any mechanism which is capable of determining exactly how the errors in the five or more erroneous code words are distributed, however. Therefore special error correction procedures must be used the correct the errors.

One such error correction procedure calculates the error values associated with a particular number of errors, v, with known locations and a single error with an unknown location. Thus the error correction processor selects v detected error locations and uses the matrix M rows associated with these locations, along with the column remainder symbols, to solve for the single unknown error location. After finding the unknown location the processor correct the v+1 errors using the procedure for v+1 errors with known locations. The value of v may be either ONE or TWO. The location of the single error is unknown because the system does not know the exact location of the erroneous symbol in a particular column, it knows only that the error is in one of the remaining locations indicated by the CRC code.

The remainder associated with a column is a linear combination of all the symbols in a column, including the erroneous symbols. Thus equations, for example, for two errors with known locations and a single error with an unknown location are:

$$REM_3 = Y(E_{V1})^*X_3^{V1} + Y(E_{V2})^*X_3^{V2} + Y(E_U)^*X_3^U$$

$$REM_2 = Y(E_{V1})^*X_2^{V1} + Y(E_{V2})^*X_2^{V2} + Y(E_U)^*X_2^U$$

$$REM_1 = Y(E_{V1})^*X_1^{V1} + Y(E_{V2})^*X_1^{V2} + Y(E_U)^*X_1^U$$

$$REM_0 = Y(E_{V1})^*X_0^{V1} + Y(E_{V2})^*X_0^{V2} + Y(E_U)^*X_0^U$$

where $Y(E_i)$ is the error value, a scalar, associated with the error in location i and $X_j^i$ is the $j^{th}$ element of row i of Matrix M (FIG. 2). These equations can be re-written:

$$X_3^U = [1/Y(E_U)]^*REM_3 + [Y(E_{V1})/Y(E_U)]^*X_3^{V1} + [Y(E_{V2})/Y(E_U)]^*X_3^{V2}$$

$$X_2^U = [1/Y(E_U)]^*REM_2 + [Y(E_{V1})/Y(E_U)]^*X_2^{V1} + [Y(E_{V2})/Y(E_U)]^*X_2^{V2}$$

$$X_1^U = [1/Y(E_U)]^*REM_1 + [Y(E_{V1})/Y(E_U)]^*X_1^{V1} + [Y(E_{V2})/Y(E_U)]^*X_1^{V2}$$

$$X_0^U = [1/Y(E_U)]^*REM_0 + [Y(E_{V1})/Y(E_U)]^*X_0^{V1} + [Y(E_{V2})/Y(E_U)]^*X_0^{V2}$$

or more generally:

$$X^U = A_R^*REM_C + A_i^*X^{V1} + A_j^*X^{V2}$$

where the $A_b$'s are scalar coefficients. Thus the vector $X^U$ corresponding to the unknown error location is a linear combination of (1) the column remainder symbol vector $REM_C$, and (2) the two rows or vectors of matrix M corresponding to the two known error locations, namely, $X^{V1}$ and $X^{V2}$.

To solve for the unknown error location, that is, determine which row or vector of matrix M can be expressed as a linear combination of the remainder symbols and the error location vectors, the error correction processor formulates a matrix M' following the procedures set forth above. As an example, let v=2. The error correction processor formulates a 3×4 matrix M' corresponding to the two selected error locations and the column remainder symbols. The error correction processor then reduces matrix M' using only row operations to a matrix M" which includes within it a (v+1)x(v+1) identity matrix. By using only row operations the error correction processor preserves the relationships between matrix columns and thus preserves the relationships between the various vectors.

In this example the reduced matrix M" includes a 3×3 identity matrix. It may take any of the following forms:

$$\begin{bmatrix} a_3 & 0 & 0 & 1 \\ b_3 & 0 & 1 & 0 \\ c_3 & 1 & 0 & 0 \end{bmatrix} \text{ or } \begin{bmatrix} 0 & a_2 & 0 & 1 \\ 0 & b_2 & 1 & 0 \\ 1 & c_2 & 0 & 0 \end{bmatrix} \text{ or}$$

$$\begin{bmatrix} 0 & 0 & a_1 & 1 \\ 0 & 1 & b_1 & 0 \\ 1 & 0 & c_1 & 0 \end{bmatrix} \text{ or } \begin{bmatrix} 0 & 0 & 1 & a_0 \\ 0 & 1 & 0 & b_0 \\ 1 & 0 & 0 & c_0 \end{bmatrix}$$

The two row operations performed in reducing matrix M' to matrix M" are: (1) a*[row i]+b*[row j] to replace row i, where "a" is any non-zero element of $GF(2^8)$ and "b" is any element of $GF(2^8)$, and (2) interchanging two rows.

Next, the error correction processor determines if a row $X^j$ of the large matrix M (FIG. 2) can be expressed as a linear combination of the rows of the matrix M" by first creating a new matrix N which is the matrix M" with the vector $X^j$ appended as a new last row. Thus the last row of matrix N has elements $sj_3$, $sj_2$, $sj_1$ and $sj_0$. The error correction processor then rotates (v=1) or permutates (v=2) the columns of matrix N until the included identity matrix is located in the upper-right corner. Thus matrix N is of the form:

$$\begin{bmatrix} a_3' & 0 & 0 & 1 \\ b_3' & 0 & 1 & 0 \\ c_3' & 1 & 0 & 0 \\ sj_3' & sj_2' & sj_1' & sj_0' \end{bmatrix}$$

The error correction processor then tests if the row $X^j$ is a linear combination of the matrix M" rows by substituting the appropriate elements of the permutated matrix N into the following equation:

$$sj_3' = a_3'*sj_0' + b_3'*sj_1' + c_3'*sj_2'$$

If the equation is satisfied $X^j$ is the unknown error location. Otherwise, the error location processor repeats the procedure for the matrix M rows $X^{j+1}$, $X^{j+2}$ ... $X^{j+19}$ in which errors are detected until the location of the error is found or all the possible error locations have been tried.

If the error correction processor is attempting to find the unknown error location using only one known error location, i.e., v=1, the equation into which the elements of the rotated matrix N are substituted is one of the following:

$$sj_2' = a_2'*sj_0' + b_2'*sj_1'$$

$$sj_3' = a_3'*sj_0' + b_3'*sj_1'$$

In this case there is a redundant equation and the calculated error location can be checked by substituting the appropriate matrix N elements into the second equation.

After error correction has been tried for all of the group 6 (FIG. 1) columns containing data symbols the error correction processor again examines blocks 5-20 for any remaining errors using the CRC code. If all the errors have been corrected the processor transfers the error-free data to the requesting user. If all the errors have not been corrected the processor corrects them, if possible, using an error correction procedure which is appropriate for the number and location of the remaining errors.

Error correction for a particular column fails if none of the rows of matrix M can be expressed as a linear combination of the rows of the associated matrix M". The system may then ignore this column and go on to correct the errors in the other columns. Thereafter, when all the columns which are correctable have been corrected and the error correction processor checks the code words for remaining errors using the CRC bits, error correction continues only if the number of code words now containing errors is smaller than the number containing errors before error correction. Otherwise, the processor labels the data uncorrectable.

An alternate method of correcting five or more errors has the error correction processor first correcting the columns containing single errors using a procedure for correcting single errors with unknown locations and then correcting any remaining errors using a procedure designed for the number and the locations of the errors. Presumably, by correcting the columns with single errors, the number of code words containing the remaining errors is reduced to four or below. In this way, one of the procedures for correcting errors with known locations can be used to complete the error correction.

To correct a single error in a particular column the system first examines the column remainder symbols. If all the remainder symbols are ZEROS there are no errors in the column and thus no error correction is required. If there is only one non-zero remainder symbol, for example, $REM_3$, the error is in column location 3 and the remainder symbol is the associated error value. If only two of the remainder symbols $REM_1$ and $REM_3$ are non-zero it means that the particular column contains two errors instead of one. The two errors are in the locations corresponding to the remainder symbols, namely, column locations 1 and 3, and the remainder symbols are the corresponding error values.

If more than two remainder symbols are non-zero the processor loads the remainder symbols in the registers 44, 46, 48, and 50 of cyclic shifter 40 (FIG. 4) and clocks the shifter until the symbol in register 50 is non-zero and the symbols in registers 44, 46, 48 are all ZEROS. If the shifter is clocked K times to produce this result the column symbol in location K+3 is in error and the symbol in register 50 is the error value associated with that symbol. If, after b cycles, an error location not found, it indicates that the column contains more than one error. The processor then ignores this column and goes on to the next one. The processor performs this single error correction procedure for each column and then tests the group 6 (FIG. 1) for any remaining errors using the CRC code. If errors remain in the code words containing data symbols the system uses another procedure, as appropriate, to correct them.

The cyclic shifter 40 may be used to correct double errors with unknown locations, also. However, before the shifter is loaded the column remainder symbols are examined as set forth above to determine if only one or two remainder symbols are non-zero. If this is the case, the errors are located in the locations corresponding to the non-zero remainder symbols and the remainder symbols are the error values corresponding to the symbols in these locations.

If more than two remainder symbols are non-zero, the error correction processor loads the remainder symbols into registers 44, 46, 48, 50 of the cyclic shifter 40. The error correction processor then examines the contents of the registers to determine if the symbols in registers 46, 48, and 50 are proportional to the last three elements of a row $X^j$ of the large matrix M (FIG. 2), namely, elements $s_{j3}$, $s_{j2}$, $s_{j1}$. Thus the error correction processor determines if:

$$REM_3 = U_j * s_{j3}$$

$$REM_2 = U_j * s_{j2}$$

$$REM_1 = U_j * s_{j1}$$

If these conditions are satisfied for a particular row $X^j$ the errors are at location 0 and location $0+j$, and the corresponding error values are $U_j * s_{j0} + REM_0$ and $U_j$, respectively. If these conditions are not satisfied for any of the matrix M rows the error correction processor clocks the cyclic shifter 40 to produce in the registers 44, 46, 48, 50 new remainder symbols $REM_0'$, $REM_1'$, $REM_2'$ and $REM_3'$. The processor then determines if these new remainder symbols satisfy the conditions set forth above. The procedure is repeated 19 times, once for each potential error location, if necessary.

It will be understood by those skilled in the art that it is unlikely for a group 6 (FIG. 1) to contain more than 4 erroneous blocks in a well designed system. Thus error correction procedures for 5 or more code words are rarely used. Accordingly, a system which includes procedures for correcting up to four code words with errors and labels groups containing 5 or more code words with errors as uncorrectable does not degrade significantly the system performance.

The error correction codes and the error correction procedures set forth above reduce the number of undetectable and/or uncorrectable errors in data recorded on magnetic tape to a level which is comparable to the level achieved with data recorded on magnetic disks. The powerful CRC code used to encode the data for error detection detects longer burst errors than prior art CRC codes. Thus these errors, which are one of the most common types of errors for tapes, are more accurately detected.

Combining the powerful detection capabilities of the CRC code with a Reed-Solomon code which quickly corrects errors with known locations results in a fast error correction scheme. Thus the transfer rate of the data is high. The particular Reed-Solomon code is particularly well suited for correcting single (column) errors with known locations. The single error correction is so fast that the error correction processor attempts to correct each column rather than determine first which columns contain errors. Accordingly, the length of an error, that is, the burst length, does not affect the time it takes the processor to correct the errors, and long burst errors are corrected as quickly as shorter errors.

The foregoing description has been limited to various embodiments of this invention. It will be apparent, however, that further variations and modifications may be made to the invention, with the attainment of some or all of the advantages of the invention. Therefore, it is the object of the appended claims to cover all such variations and modifications as come within the true spirit and scope of the invention.

I claim:

1. A system for encoding data symbols to form error correction code words, said system including:
   A. means for electrically receiving a stream of data symbols;
   B. an encoder for encoding the received data symbols to form error correction code words, said encoder including—
      i. first encoding means for encoding said received data symbols in segments of d symbols to generate CRC redundancy symbols using a cyclic redundancy code having as a generator polynomial g(x) (in octal form):

$$g(x) = (3)*(3)*(100003)*(102043)*(110013)*(1560513)$$

or $$g(x) = 2413607036565172433223$$

where the vector components are the binary coefficients of the terms of the polynomial representing from left-to-right the coefficients of the highest-to-lowest degree terms, said first encoding means appending said generate CRC redundancy symbols to the associated data symbols to form a series of CRC code words, and
      ii. second encoding means for electrically receiving said CRC code words and forming error correction code words by encoding a predetermined number, b, of data symbols from b CRC code words in accordance with an error correction code thereby generating error correction redundancy symbols and appending said error correction redundancy symbols to the associated b data symbols.

2. The encoding system of claim 1, wherein said first encoding means further encodes corresponding error correction redundancy symbols in a predetermined number of error correction code words to generate CRC redundancy symbols, said first encoding means appending said CRC redundancy symbols to the associated error correction redundancy symbols to form CRC code words.

3. The encoding system of claim 2, wherein said second encoding means encodes the data symbols and the CRC redundancy symbols using a Reed-Solomon code having as a generator polynomial G(x):

$$\begin{aligned} G(x) &= (x + \alpha^0) * (x + \alpha^1) * (x + \alpha^2) * (x + \alpha^3) \\ &= x^4 + \alpha^{75} x^3 + \alpha^{249} x^2 + \alpha^{78} x + \alpha^6 \end{aligned}$$

where $\alpha$ is the primitive element of the Galois Field, "*" represents Galois Field multiplication and "+" represents Galois Field addition.

4. A method for encoding a stream of data symbols to allow detection of errors, said method including the steps of:
   A. electrically receiving the data symbols;
   B. encoding the data symbols in d-symbol segments to generate error detection redundancy symbols using a cyclic redundancy code having as a generator polynomial g(x) (in octal form):

$$g(x) = (3)*(3)*(100003)*(102043)*(110013)*(1560513)$$

-continued or $g(x) = 2413607036565172433223$ where the vector components are the binary coefficients of the terms of the polynomial representing from left-to-right the coefficients of the highest-to-lowest degree terms;

C. appending the error detection redundancy symbols to the associated d data symbols to form CRC code words; and D. electrically storing the CRC code words.

5. A method for encoding data to form error correction code words, said method including the steps of:

A. electrically receiving the data in the form of data symbols;

B. encoding the data in d-symbol segments to generate error detection redundancy symbols using a cyclic redundancy code having as a generator polynomial g(x) (in octal form):

$g(x) = (3)*(3)*(100003)*(102043)*(110013)*(1560513)$ or $g(x) = 2413607036565172433223$ where the vector components are the binary coefficients of the terms of the polynomial representing form left-to-right the coefficients of the highest-to-lowest degree terms;

C. appending said redundancy symbols to the data symbols to form a series of CRC code words;

C. encoding using an error correction code a predetermined number, b, of data symbols from b CRC code words to generate error correction redundancy symbols;

E. appending the error correction redundancy symbols to the corresponding data symbols to form error correction code words; and F. electrically storing the error correction code words.

6. The encoding method of claim 5, wherein said step of encoding a stream of d data symbols includes the steps of:

i. encoding the corresponding error correction redundancy symbols in a predetermined number of error correction code words to generate CRC redundancy symbols; and ii. appending the CRC redundancy symbols to the error correction redundancy symbols to form CRC code words.

7. The encoding method of claim 6, wherein said step of encoding using an error correction code further includes encoding the data symbols using a Reed-Solomon code having as a generator polynomial G(x):

$$G(x) = (x + \alpha^0) * (x + \alpha^1) * (x + \alpha^2) * (x + \alpha^3)$$
$$= x^4 + \alpha^{75}x^3 + \alpha^{249}x^2 + \alpha^{78}x + \alpha\&^6$$

where $\alpha$ is the primitive element of the Galois Field, "*" represents Galois Field multiplication and "+" represents Galois Field addition.

8. A method of correcting errors in data, the data being encoded for detection using a CRC code to form CRC redundancy bits, the redundancy bits and the data forming a CRC code word, and encoded for error correction using an error correction code to form error correction redundancy symbols, the error correction redundancy symbols and the data forming an error correction code word, said error method including the steps of:

A. electrically receiving encoded data;

B. decoding the data using the CRC code to detect the locations of errors in the data;

C. correcting the errors in the detected locations provided that only v errors are detected, where v is less than a predetermined maximum value, f, said error correcting step including the steps of:

1. calculating a remainder for each error correction code word, 2. determining error values by simultaneously solving v equations, each of which is:

$$\sum_{i=1}^{v} X_{ik}Y(e_i) = REM_k$$

where $X_{ik}$ is the $k^{th}$ term of the vector $X^i$ modulo G(x), G(x) being the generator polynomial of the error correction code used to encode the data, and $Y(e_1)$ is the error value associated with the symbol in the location of the $i^{th}$ detected error said solving step including the steps of:

i. formulating a matrix M' for each error correction code word with a non-zero remainder, the matrix M' having:

a. v rows corresponding to the detected errors, the v rows having elements corresponding to a vector with components representing X· modulo G(x) where e is the location of a detected error and G(x) is the generator polynomial of the error correction code used to encode the data, and b. a last row corresponding to the code word remainder, ii. manipulating the matrix M' columns to form a matrix M'' having a v-by-v identity matrix in the first v matrix columns of matrix rows 1-v and having ZEROS as the remaining elements of the matrix rows 1-v, and, iii. selecting as the error values associated with the symbols in the detected error locations the elements of the last row of matrix M''

4. correcting the erroneous data symbols by combining the symbols in the detected error locations with the associated error values to produce error-free data symbols.

9. The method of correcting errors of claim 8, wherein said step of calculating a remainder includes the steps of:

A. generating new error correction code redundancy symbols corresponding to the data; and B. adding, by using Galois Field addition, the new error correction code redundancy symbols to the error correction code redundancy symbols in the data.

10. The method of correcting errors of claim 9, wherein said method includes the step of calculating the error value for a single error in a location corresponding to a data symbol by generating a quotient by dividing an element of matrix M' row v by an element of matrix M' row (v-1), the elements being in a matrix M' column containing only ZEROS in rows 1-(v-2), said quotient being the error value.

11. The method of correcting errors of claim 10, wherein said method further includes the step of labeling code words with remainders equal to ZERO as error-free and refraining from performing further error correction on the symbols in these code words.

12. The method of correcting errors of claim 11, wherein said method further includes, for determining the location of an error in an error correction code word when there are more than f detected errors, the steps of:
   A. selecting v error locations from the detected locations and supplying the selected locations to the formulating means, said formulating means formulating a matrix M' corresponding to the selected rows:
   B. manipulating the rows of matrix M' to form a matrix M" having a v-by-v identity matrix in the first v rows;
   C. appending a vector X·, where e is a location of a detected error other than a selected location, to the matrix M" as a last row to form a matrix N;
   D. manipulating the columns of matrix N until the identity matrix contained therein is located in the upper-right-hand corner of the matrix;
   E. determining if the appended row X· is a linear combination of the rows of matrix M', by determining if the elements of the manipulated matrix N satisfy the conditions:

$s_{j2}' = a_2'^* s_{j0}' + b_2'^* s_{j1}'$ $s_{j3}' = a_3'^* s_{j0}' + b_3'^* s_{j1}'$ if the number of selected error locations is one, or the condition:

$s_{j3}' = a_3'^* s_{j0}' + b_3'^* s_{j1}' + c_3'^* s_{j2}'$ if the number of selected error locations is two;
   F. labeling as erroneous the symbol in location e of the codeword if the appended row is a linear combination of the rows of matrix M'; and
   G. repeating steps C-F for a next detected error location if the appended row is not a linear combination of the rows of matrix M'.

13. A data encoding system for encoding a stream of data symbols to allow detection of errors, said system including:
   i. means for electrically receiving a stream of data symbols;
   ii. an encoder for encoding the stream of data symbols in d-symbol segments to form error detection redundancy symbols, said encoder using a cyclic redundancy code having as a generator polynomial g(x) (in octal form):

$g(x) = (3)^*(3)^*(100003)^*(102043)^*(110013)^*(1560513)$ or $g(x) = 2413607036565172433223$ where the vector components are the binary coefficients of the term s of the polynomial representing from left-to-right the coefficients of the highest-to-lowest degree terms;
   iii. means for appending said error detection redundancy symbols to the associated d-symbol segments to form CRC code words; and
   iv. means for electrically storing said CRC code words.

14. A data encoding system for encoding a stream of data symbols to allow detection of errors, said system including:
   i. means for electrically receiving a stream of data symbols;
   ii. an encoder for encoding the stream of data in d-symbol segments to form error detection redundancy symbols,
   said encoder using a cyclic redundancy code having as a generator polynomial g*(x) (in octal form):

$g^*(x) = (3)^*(3)^*(140001)^*(1142041)^*(150011)^*(1512073)$ or $g^*(x) = 3113305362565703417205$ and the vector components are the binary coefficients of the terms of the polynomial representing form left-to-right the coefficients of the highest-to-lowest degree terms, and
   iii. means for appending said error detection redundancy symbols to the associated d-symbol segments to form CRC code words; and
   iv. means for electrically storing said CRC code words.

15. A method for encoding a stream of data symbols to allow detection of errors, said method including the steps:
   A. electrically receiving the stream of data symbols;
   B. encoding the stream of data symbols in d-symbols segments to form error detection redundancy symbols using a cyclic redundancy code having as a generator polynomial g(x)*, where g(x) is (in octal form):

$g^*(x) = (3)^*(3)^*(140001)^*(1142041)^*(150011)^*(1512073)$ or $g^*(x) = 3113305362565703417205$ and the vector components are the binary coefficients of the terms of the polynomial representing form left-to-right the coefficients of the highest-to-lowest degree terms; and
   C. appending the error detection redundancy symbols to the associated d-symbol segment to form CRC code words; and
   D. electrically storing the CRC code words.

* * * * *